United States Patent [19]

Kim et al.

[11] Patent Number: 5,684,745
[45] Date of Patent: Nov. 4, 1997

[54] SRAM DEVICE WITH A BIT LINE DISCHARGE CIRCUIT FOR LOW POWER

[75] Inventors: Seung Min Kim; Hoon Mo Yoon, both of Kyoungkido, Rep. of Korea

[73] Assignee: Hyundai Electronics Industries Co., Ltd., Kyoungkido, Rep. of Korea

[21] Appl. No.: 673,487

[22] Filed: Jul. 1, 1996

[30] Foreign Application Priority Data

Jun. 30, 1995 [KR] Rep. of Korea .................. 1995-19168

[51] Int. Cl.[6] .................................................. G11C 7/00
[52] U.S. Cl. ...................... 365/189.11; 365/203; 365/204
[58] Field of Search ............................... 365/189.11, 203, 365/204, 154, 207

[56] References Cited

U.S. PATENT DOCUMENTS 5,337,270  8/1994  Kawata et al. ......................... 36/203
5,408,437  4/1995  Cho et al. .............................. 365/203

Primary Examiner—David C. Nelms
Assistant Examiner—F. Niranjan
Attorney, Agent, or Firm—Jacobson, Price, Holman & Stern, PLLC

[57] ABSTRACT

The present invention provides an SRAM device comprising a first discharger for discharging a first bit line at the write operation when the first bit line is at a low level; a second discharger for discharging a second bit line at the write operation when the second bit line is at a low level; and a pull-up transistor for providing power with the first and second bit lines at the read operation and preventing the power supply from being provided with the first and second bit lines at the write operation, whereby the first or second dischargers converts the voltage level in low level bit line into a ground level when the write operation is performed.

5 Claims, 2 Drawing Sheets ns with the present invention.

SRAM DEVICE WITH A BIT LINE DISCHARGE CIRCUIT FOR LOW POWER

BACKGROUND OF THE INVENTION

1. Field of the Invention

The present invention relates to an SRAM device, and more particularly, to an SRAM device having bit lines capable of writing data into a memory cell with low power consumption.

2. Description of Prior Art

With the change in a power supply from 5V to 3.3V, an error is generated if the conventional circuit for 5V is used in 3.3V. That is to say, in case where a bit line pull-up circuit for 5V is used in an SRAM for 3.3V, a write operation is not achieved in the memory cell.

FIG. 1 is a schematic configuration showing a conventional SRAM device.

As shown in FIG. 1, the SRAM device consists of a memory cell 10, a precharge part 9, a bit line selecting part 12, a write part 13 and a sense amplifier 19.

The memory cell 10 is selected by a word line WL and data stored in the memory are read out. The precharge part 9 is composed of PMOS transistors P1 and P2 to precharge a first bit line BL and a second bit line /BL (low in active state). Data are stored in the memory cell 10, which is selected by the word lines, are amplified by the sense amplifier 19 when Y-transfer gate transistors, PMOS transistors P3 and P4, are turned on by a selecting signal /Y from a column decoder.

In case of the write operation, since a write enable signals WE (high level signal) and /WE (low level signal) are applied to NMOS transistors N1 and N2 and PMOS transistors P5 and P6, respectively, the NMOS transistors N1 and N2 and the PMOS transistors P5 and P6 are all turned on.

At this time, when data from a data input terminal are input through inverters 3 and 4, the potential at node A is transferred to the first bit line BL through the NMOS transistor N1 and the PMOS transistor P5. However, since an inverter 5 inverts data from the data input terminal, the second bit line /BL is in a low level state. When the Vcc voltage level is transferred to the bit line BL or /BL as a high level signal, the potential on the bit line BL or BL is Vcc voltage. On the other hand, when a low level is transferred to the bit line BL or /BL, the potential on the bit line BL or /BL is not a ground level, but is the threshold voltage Vtp of the PMOS transistors P3 and P4.

As stated above, the write operation can not be performed at a low power mode such as 3.3V, because the low level transferred to the bit line BL or /BL is not a ground level, but is the threshold voltage Vtp, for example, 0.5V. That is to say, since the voltage deference between the first bit line BL and the second bit line /BL is 3.3V-Vtp at the write operation in the power mode such as 3.3V, it is difficult to perform the write operation in the memory cell for want lack of because of insufficient voltage deference.

Accordingly, since the low level in the bit line is not a ground level in the conventional SRAM device, errors can break out at the write operation.

SUMMARY OF THE INVENTION

An object of the invention is to provide an SRAM device capable of decreasing power consumption, by dropping the potential of one of bit lines at the write operation using discharge circuits coupled to bit lines.

Another object of the invention is to provide an SRAM device capable of preventing errors from being generated at the write operation.

In accordance with the present invention, there is provided an SRAM device comprising a first discharge means for discharging a first bit line at the write operation when the first bit line is at a low level; a second discharge means for discharging a second bit line at the write operation when the second bit line is at a low level; and a pull-up means for providing power with the first and second bit lines at the read operation and preventing the power supply from being provided with the first and second bit lines at the write operation, whereby the first or second discharge means converts the voltage level in low level bit line into a ground level when the write operation is performed.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Hereinafter, an SRAM device according to the present invention will be described in detail referring to FIG. 2.

Figure 2:
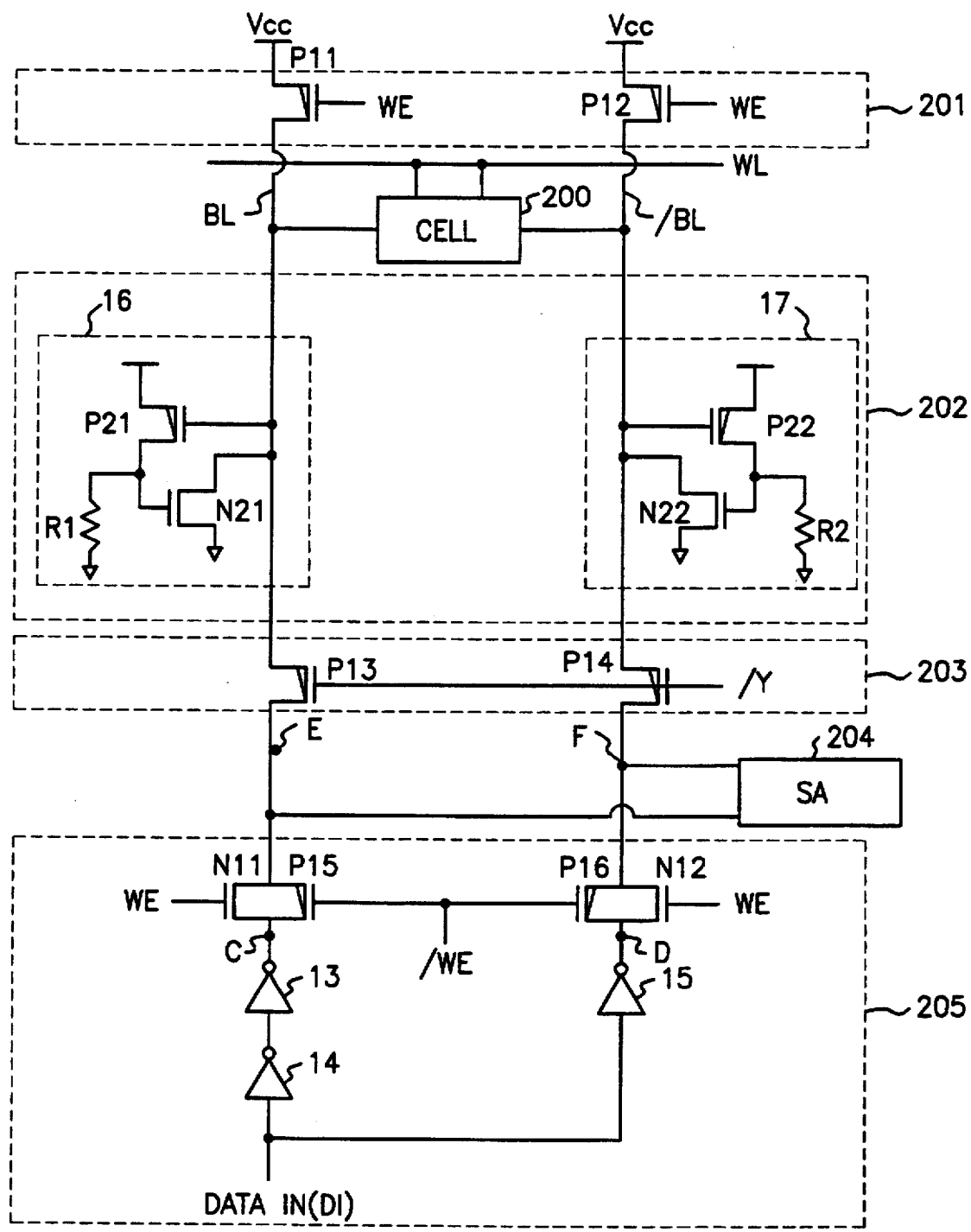
FIG. 2 is a schematic view illustrating an SRAM device in accordance with the present invention.

First, FIG. 2 is a schematic view illustrating an SRAM device in accordance with the present invention. As shown in FIG. 2, the SRAM device in accordance with the present invention consists of a memory cell 200, a bit line pull-up part 201, a discharge part 202, a bit line selecting part 203, a sense amplifier 204 and a write part 205.

As illustrated in FIG. 2, when the memory cell 200 is selected by a word line WL, data stored in the memory 200 are read out at the read operation or data are stored in the memory cell 200 at the write operation.

The bit line pull-up part 201 consists of PMOS transistors P11 and P12 which connect the power supply Vcc to a first and second bit lines BL and /BL (low in active state) in response to a write signal, respectively. Data stored in the memory cell 200, which is selected by the word lines, are amplified by the sense amplifier 204 when the bit line selecting part 203 having PMOS transistors P13 and P14, are turned on according to the selecting signal /Y from a column decoder.

Figure 1:
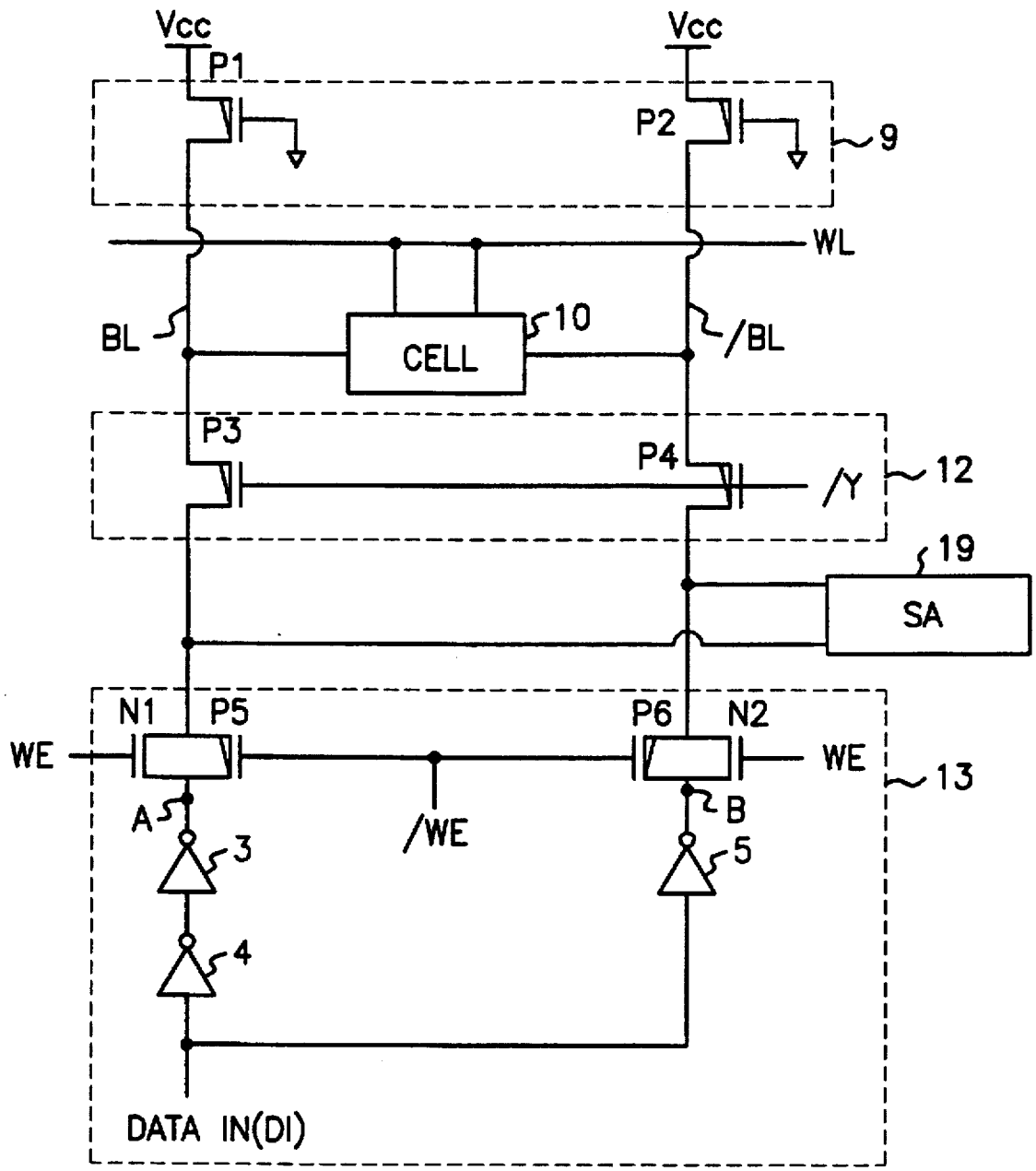
FIG. 1 is a schematic view illustrating a conventional SRAM device.

Similarly, the discharge part 202 consists of a first and second bit line discharge parts 16 and 17 coupled to a first and second bit lines BL and /BL, respectively, to transit the low level of the bit line to a ground level. Also, the write part 205 in FIG. 2 has the same configuration as the write part 13 in FIG. 1.

That is, the main features of the present invention are the the bit line pull-up part 201 and the discharge part 202. The first bit line discharge part 16 consists of a PMOS transistor P21, an NMOS transistor N21 and a resister R1 coupled to the gate of the NMOS transistor N21.

The PMOS transistor P21 has a gate coupled to the first bit line BL and a source coupled to a voltage supply. The NMOS transistor N21 has a gate coupled to a drain of the PMOS transistor P21, a drain coupled to the first bit line BL and a source coupled to the ground level.

Similarly, the second bit line discharge part 17 in the discharge part 202 consists of a PMOS transistor P22, an NMOS transistor N22 and a resister R2. The PMOS transistor P22 has a gate coupled to the second bit line /BL and a source coupled to a voltage supply. The NMOS transistor N22 has a gate coupled to a drain of the PMOS transistor P22, a drain coupled to the second bit line /BL and a source coupled to the ground level.

At the read operation, the NMOS transistor N11 and the PMOS transistor P15, which are coupled to the first bit line BL, are turned off because the write enable signals WE and /WE are respectively at a low and high level. Also, the NMOS transistor N12 and the PMOS transistor P16, which are coupled to the second bit line /BL, are turned off because the write enable signals WE and /WE are respectively at a low and high level. Furthermore, the PMOS transistors P11 and P12 in the bit line pull-up part 201 are turned on. Accordingly, the voltage level of the first and second bit lines is close to the power source Vcc.

As a result, since the first bit line BL has Vcc voltage level and the second bit line /BL has Vcc-α (α is a few hundred mV) according to data stored in the memory cell, the PMOS transistors P21 and P22 are turned off so that the NMOS transistors N21 and N22 are turned off.

At the write operation, the NMOS transistors N11 and N12 and the PMOS transistors P15 and P16 are all turned on by the write enable signals WE and /WE, respectively. At this time, if high data from a data input terminal DI are input into the first bit line BL through inverters 13 and 14 and low data are input into the second bit line /BL through an inverters 15, nodes C and E have the same high voltage level Vcc and nodes D and F have the same low voltage level. Also, the PMOS transistors P11 and P12 are all turned off.

Accordingly, since the first bit line BL is at Vcc level through the PMOS transistor P13, which is controlled by a column decoder, the PMOS transistor P21 and the NMOS transistor N21 in the first bit line discharge part 16 coupled to the first bit line BL are turned off.

On the other hand, since node F is at a low level, the second bit line /BL is at a low level through the PMOS transistor 14. However, the second bit line /BL has Vtp voltage due to the transfer characteristics of the PMOS transistor 14. Accordingly, the PMOS transistor P22 is turned on and the gate of the NMOS transistor N22 is at a high level so that the second bit line discharge part 17 coupled to the second bit line /BL is driven, thereby dropping the voltage level thereof to a ground level. Although a current path is created by the resistor R2 coupled to the gate of the NMOS transistor N22, it is not difficult for the NMOS transistor N22 to be turned on because of the high resistance of the resistor R2.

At this write operation, because the second bit line /BL is at a complete ground level with the second bit line discharge part 17, the SRAM device can be used in 3.3V power supply. Also, because the second bit line /BL is at a ground level, an error generation rate is minimized in the data write operation.

As apparent from above description, the present invention is effective for meeting the demands of low power devices and low error generation rate at the write operation in SRAM devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An SRAM device with a bit line discharge circuit for low power, comprising:
   a column selecting means for selecting a bit line;
   a first discharge means coupled to a first bit line, wherein said first discharge means discharges the first bit line when a low level is transmitted to the first bit line from a data write circuit through said column selecting means;
   a second discharge means coupled to a second bit line, wherein said second discharge means discharges the second bit line when a low level is transmitted to the second bit line from a data write circuit through said column selecting means; and
   a pull-up means for precharging the first bit line and the second bit lines, preventing the power from being provided with the first bit lines and the second bit line at the write operation,
   whereby said first or second discharge means converts the voltage level in a low level bit line into a ground level when the write operation is performed.

2. The SRAM device in accordance with claim 1, wherein the SRAM device comprise a column selecting means composed of PMOS transistors.

3. The SRAM device in accordance with claim 2, wherein the first and second discharge means are enabled by a voltage signal which is the same as the threshold voltage of the PMOS transistors in the column selecting means.

4. An SRAM device with a bit line discharge circuit for low power, comprising:
   a column selecting means for selecting a bit line, wherein said column selecting means comprises PMOS transistors;
   a first discharge means coupled to a first bit line, wherein said first discharge means discharges the first bit line when a low level is transmitted to the first bit line from a data write circuit through said column selecting means, wherein the first discharge means comprises:
      a PMOS transistor having a gate coupled to the first bit line and a source coupled to a voltage supply;
      an NMOS transistor having a gate coupled to a drain of the PMOS transistor, a drain coupled to the first bit line and a source coupled to a ground level; and
      a resistor means coupled to the gate of the NMOS transistor;
   a second discharge means coupled to a second bit line, wherein said second discharge means discharges the second bit line when a low level is transmitted to the second bit line from a data write circuit through said column selecting means; and
   a pull-up means for precharging the first bit line and the second bit line, preventing power from being provided with the first bit line and the second bit line at the write operation,
   whereby said first or second discharge means converts the voltage level in a low level bit line into a ground level when the write operation is performed.

5. An SRAM device with a bit line discharge circuit for low power, comprising:
   a column selecting means for selecting a bit line, wherein said column selecting means comprises PMOS transistors;
   a first discharge means coupled to a first bit line, wherein said first discharge means discharges the first bit line when a low level is transmitted to the first bit line from a data write circuit through said column selecting means;

a second discharge means coupled to a second bit line, wherein said second discharge means discharges the second bit line when a low level is transmitted to the second bit line from a data write circuit through said column selecting means, wherein the second discharge means comprises:
 a PMOS transistor having a gate coupled to the second bit line and a source coupled to a voltage supply;
 an NMOS transistor having a gate coupled to a drain of the PMOS transistor, a drain coupled to the second bit line and a source coupled to a ground level; and
 a resistor means coupled to the gate of the NMOS transistor; and
a pull-up means for precharging the first bit line and the second bit line, preventing power from being provided with the first bit line and the second bit line at the write operation,
whereby said first or second discharge means converts the voltage level in a low level bit line into a ground level when the write operation is performed.

* * * * *